(12) United States Patent
Vezza et al.

(10) Patent No.: US 11,261,524 B2
(45) Date of Patent: Mar. 1, 2022

(54) CHEMICAL VAPOR DEPOSITION PROCESS AND COATED ARTICLE

(71) Applicant: SILCOTEK CORP., Bellefonte, PA (US)

(72) Inventors: Thomas F. Vezza, State College, PA (US); James B. Mattzela, Port Matilda, PA (US); Gary A. Barone, State College, PA (US); Jesse Bischof, State College, PA (US); David A. Smith, Bellefonte, PA (US)

(73) Assignee: SilcoTek Corp., Bellefonte, PA (US)

( * ) Notice: Subject to any disclaimer, the term of this patent is extended or adjusted under 35 U.S.C. 154(b) by 214 days.

(21) Appl. No.: 16/379,236

(22) Filed: Apr. 9, 2019

(65) Prior Publication Data

US 2019/0309414 A1 Oct. 10, 2019

Related U.S. Application Data

(60) Provisional application No. 62/654,780, filed on Apr. 9, 2018.

(51) Int. Cl.
*C23C 16/44* (2006.01)
*B32B 15/00* (2006.01)
*H01L 21/02* (2006.01)

(52) U.S. Cl.
CPC .............. *C23C 16/44* (2013.01); *B32B 15/00* (2013.01); *H01L 21/02123* (2013.01)

(58) Field of Classification Search
CPC ....... C23C 16/24; C23C 16/44; C23C 16/045; C23C 16/45523; B32B 15/00; H01L 21/0217
USPC ...................................................... 427/255.28
See application file for complete search history.

(56) References Cited

U.S. PATENT DOCUMENTS

2005/0118837 A1 * 6/2005 Todd ................. H01L 21/31662
438/791

FOREIGN PATENT DOCUMENTS

WO WO-2017040623 A1 * 3/2017 ....... C23C 16/45523

* cited by examiner

*Primary Examiner* — Tri V Nguyen
(74) *Attorney, Agent, or Firm* — Saxton & Stump, LLC

(57) ABSTRACT

Chemical vapor deposition processes and coated articles are disclosed. The process includes a first introducing of a first amount of silane to the enclosed chamber, the first amount of the silane remaining within the enclosed chamber for a first period of time, a first decomposing of the first amount of the silane during at least a portion of the first period of time, a second introducing of a second amount of the silane to the enclosed chamber, the second amount of the silane remaining within the enclosed chamber for a second period of time, and a second decomposing of the second amount of the silane during at least a portion of the second period of time. The process is devoid of inert gas purging between the first decomposing and the second introducing and/or produces a chemical vapor deposition coating devoid of hydrogen bubbles.

18 Claims, 1 Drawing Sheet

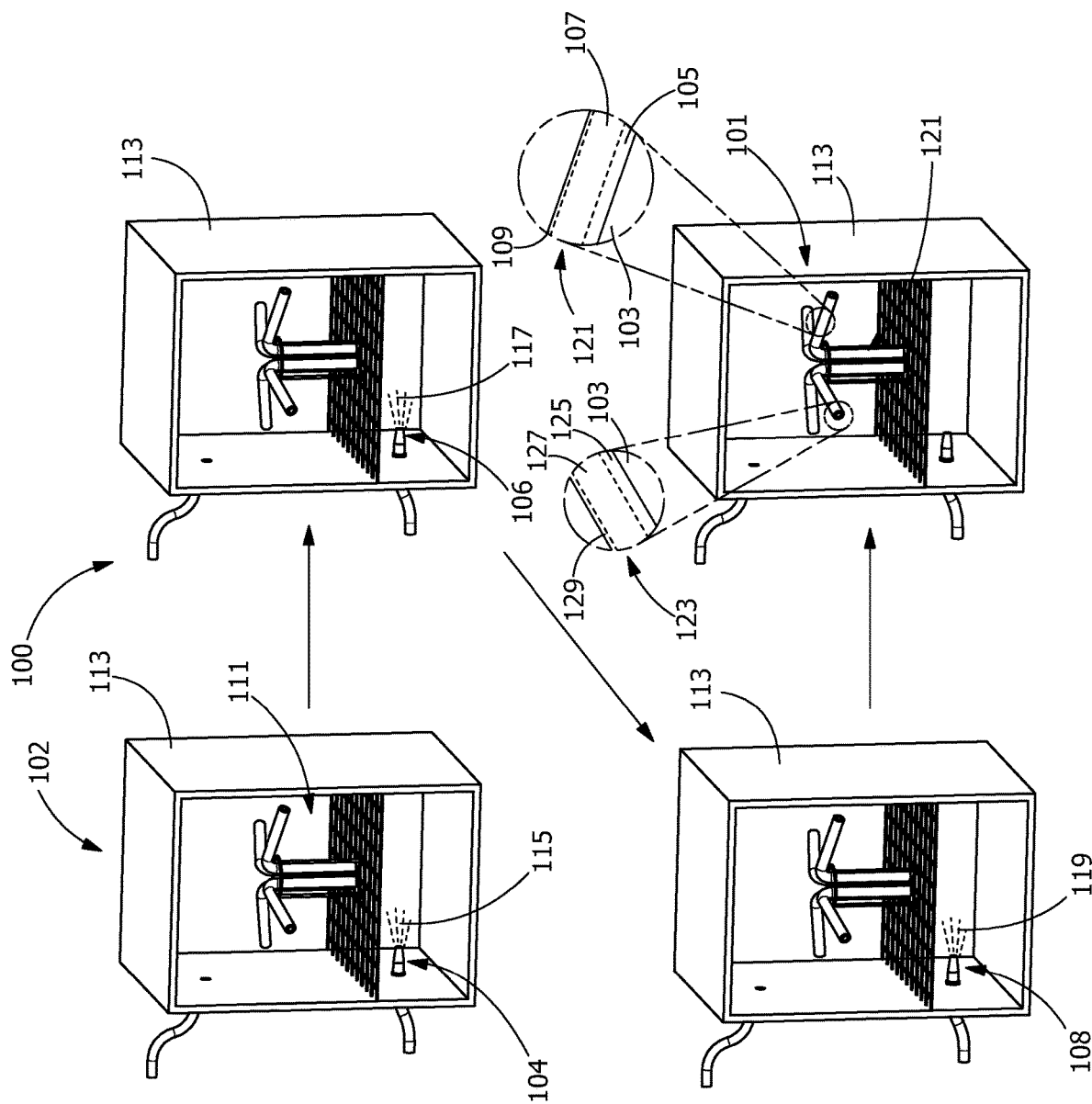

CHEMICAL VAPOR DEPOSITION PROCESS AND COATED ARTICLE

PRIORITY

The present application is a non-provisional patent application claiming priority and benefit of U.S. Provisional Patent Application No. 62/654,780, filed Apr. 9, 2018, and entitled "CHEMICAL VAPOR DEPOSITION PROCESS AND COATED ARTICLE," which is hereby incorporated by reference in its entirety.

FIELD OF THE INVENTION

The present invention is directed to chemical vapor deposition processes and coated articles. More particularly, the present invention is directed to thermal chemical vapor deposition processes and coated articles having all exposed surfaces coated.

BACKGROUND OF THE INVENTION

Thermal chemical vapor deposition using silane is known. Several patents, including U.S. Pat. Nos. 6,511,760 and 6,444,326, both of which are incorporated by reference in their entirety, discuss use of silane.

There is an ongoing need to improve properties of coatings produced with silane or other fluids by chemical vapor deposition, especially thermal chemical vapor deposition. Adhesion is one such property.

Chemical vapor deposition processes and coated articles that show one or more improvements in comparison to the prior art would be desirable in the art.

BRIEF DESCRIPTION OF THE INVENTION

In an embodiment, a chemical vapor deposition process includes positioning an article having a substrate within an enclosed chamber, a first introducing of a first amount of silane to the enclosed chamber, the first amount of the silane remaining within the enclosed chamber for a first period of time, a first decomposing of the first amount of the silane during at least a portion of the first period of time, and then, a second introducing of a second amount of the silane to the enclosed chamber, the second amount of the silane remaining within the enclosed chamber for a second period of time, and a second decomposing of the second amount of the silane during at least a portion of the second period of time. The chemical vapor deposition process is devoid of purging between the first decomposing and the second introducing, or a combination thereof.

In another embodiment, a chemical vapor deposition process includes providing a substrate within an enclosed chamber, a first introducing of a first amount of silane to the enclosed chamber, the first amount of the silane remaining within the enclosed chamber for a first period of time, a first decomposing of the first amount of the silane during at least a portion of the first period of time, and then, a second introducing of a second amount of the silane to the enclosed chamber, the second amount of the silane remaining within the enclosed chamber for a second period of time, and a second decomposing of the second amount of the silane during at least a portion of the second period of time. The chemical vapor deposition process produces a chemical vapor deposition coating devoid of hydrogen bubbles.

In another embodiment, a coated article includes a substrate and a chemical vapor deposition coating positioned on the substrate, the coating comprising a first silicon-containing layer and a second silicon-containing layer. The chemical vapor deposition coating has adhesion to the substrate that is greater than a comparative adhesion between the substrate and a comparative coating formed under the same conditions but with an inert purge between the first decomposing and the second decomposing.

Other features and advantages of the present invention will be apparent from the following more detailed description, taken in conjunction with the accompanying drawings which illustrate, by way of example, the principles of the invention.

BRIEF DESCRIPTION OF THE DRAWINGS

FIG. 1 is a schematic perspective view of a thermal chemical vapor deposition process, according to an embodiment of the disclosure.

Wherever possible, the same reference numbers will be used throughout the drawings to represent the same parts.

DETAILED DESCRIPTION OF THE INVENTION

Provided are chemical vapor deposition processes and coated articles. Embodiments of the present disclosure, for example, in comparison to concepts failing to include one or more of the features disclosed herein, have greater adhesion, have higher concentrations of hydrogen, permit treatment of a wide range of geometries (for example, narrow channels/tubes, three-dimensionally complex geometries, and/or hidden or non-line-of-site geometries, such as, in needles, tubes, probes, fixtures, complex planar and/or non-planar geometry articles, simple non-planar and/or planar geometry articles, and combinations thereof), permit treatment of a bulk of articles, are capable or being used in or replacing components that are used in industries traditionally believed to be too sensitive for processes that are not flow-through processes (for example, based upon compositional purity, presence of contaminants, thickness uniformity, and/or amount of gas phase nucleation embedded within), allow materials to be used as a substrate that would otherwise produce an electrical arc in a plasma environment, or permit a combination thereof.

Referring to FIG. 1, in one embodiment, a coated article 101 includes a substrate 103 and a thermal chemical vapor deposition coating 121 positioned on the substrate 103. Suitable components capable of being produced into the coated article 101 include, but are not limited to, fittings (for example, unions, connectors, adaptors, other connections between two or more pieces of tubing, for example, capable of making a leak-free or substantially leak-free seal), compression fittings (including ferrules, such as, a front and back ferrule), tubing (for example, coiled tubing, tubing sections such as used to connect a sampling apparatus, pre-bent tubing, straight tubing, loose wound tubing, tightly bound tubing, and/or flexible tubing, whether consisting of the interior being treated or including the interior and the exterior being treated), valves (such as, gas sampling, liquid sampling, transfer, shut-off, or check valves, for example, including a rupture disc, stem, poppet, rotor, multi-position configuration, able to handle vacuum or pressure, a handle or stem for a knob, ball-stem features, ball valve features, check valve features, springs, multiple bodies, seals, needle valve features, packing washers, and/or stems), quick-connects, sample cylinders, regulators and/or flow-controllers (for example, including o-rings, seals, and/or diaphragms), injection ports (for example, for gas chromatographs), in-line filters (for example, having springs, sintered metal filters, mesh screens, and/or weldments), glass liners, gas chromatograph components, liquid chromatography components, components associated with vacuum systems and chambers, components associated with analytical systems, sample probes, control probes, downhole sampling containers, drilled and/or machined block components, manifolds, particles, powders, or a combination thereof.

The coating 121 includes a first silicon-containing layer 105 and a second silicon-containing layer 107. In one embodiment, one or more additional layers 109 are included. The additional layer(s) 109 are silicon-containing and/or functionalized (for example, with a carbon-containing group or a fluoro-group). Adhesion between the coating 121 and the substrate 103 and/or between the first silicon-containing layer 105, the second silicon-containing layer 107, and/or the additional layer(s) 109 is increased in comparison comparative coatings (not shown) produced with one or more intermediate purges (for example, inert gas purges, such as, nitrogen purges or argon purges).

Although not intending to be bound by theory, it is believed that the adhesion within the coated article 101 results from lower film stress, for example, which is a consequence of individual layers of the coating 121 having coefficients of thermal expansion that are similar or the same and/or microstructures that are similar or the same. Such distinctions are believed to be based upon relative differences in film stress as opposed to an absolute value. It is believe that the properties of the layers of the coated article 101 are more similar than layers of comparative coatings produced under the same conditions but having one or more of the intermediated purges.

The chemical vapor deposition process 100 includes positioning an uncoated article 111 (or a plurality of the uncoated articles 111) having the substrate 103 within an enclosed chamber 113. In one embodiment, the positioning is manually with the uncoated articles 111 being arranged generally horizontally ("generally" being within a 1 degree, 5 degrees, 10 degrees, or 15 degrees) or otherwise inconsistent with the direction of gravity. In another embodiment, the positioning is manually with the uncoated articles 111 being arranged in a vertical (stacked) orientation separated by supports (and thus obstructed from line-of-sight), arranged laterally or perpendicular to gravity (for example, with all or most openings being generally perpendicular to gravity, "generally" being within a 1 degree, 5 degrees, 10 degrees, or 15 degrees), arranged in an overlapping manner that reduces the amount of volume available for gas phase nucleation, positioned in a fixture corresponding with the geometry of the articles, or a combination thereof.

The process 100 continues with a first introducing (step 104) of a first amount 115 of a fluid (gas or liquid), for example, silane, to the enclosed chamber 113. The first amount 115 of the fluid remains within the enclosed chamber 113 for a first period of time. The process continues with a first decomposing (step 110) of the first amount 115 of the fluid during at least a portion of the first period of time. The process 100 then includes a second introducing (step 106) of a second amount 117 of the fluid to the enclosed chamber 113, the second amount 117 of the fluid remaining within the enclosed chamber 113 for a second period of time. The process 100 continues with a second decomposing (step 112) of the second amount 117 of the fluid during at least a portion of the second period of time. The process 100 produces the coated article 101 (or a plurality of the coated articles 101).

The coating 121 is produced on all exposed surfaces. As used herein, the term "exposed," with regard to "exposed surfaces," refers to any surface that is in contact with gas during the process, and is not limited to line-of-site surfaces or surfaces proximal to line-of-site directions as are seen in flow-through chemical vapor deposition processes that do not have an enclosed vessel. As will be appreciated by those skilled in the art, the coated article 101 is capable of being incorporated into a larger component or system (not shown).

The coating 121 is produced, for example, thereby providing features and properties unique to being produced through the process 100, according to the disclosure, which is a static process using the enclosed vessel contrasted to flowable chemical vapor deposition that has concurrent flow of a precursor into and out of a chamber. As used herein, the phrase "thermal chemical vapor deposition" refers to a reaction and/or decomposition of one or more gases, for example, in a starved reactor configuration, and is distinguishable from plasma-assisted chemical vapor deposition, radical-initiated chemical vapor deposition, catalyst-assisted chemical vapor deposition, sputtering, atomic layer deposition (which is limited to a monolayer molecular deposition per cycle in contrast being capable of more than one layer of molecular deposition), and/or epitaxial growth (for example, growth at greater than 700° C.). In one embodiment, the coating 121 is on the coated article 101 on regions that are unable to be coated through line-of-sight techniques.

The enclosed vessel 113 has any dimensions or geometry that allows suitable temperature and the pressures. In one embodiment, the dimensions for the enclosed vessel include, but are not limited to, having a minimum width of greater than 5 cm, greater than 10 cm, greater than 20 cm, greater than 30 cm, greater than 100 cm, greater than 300 cm, greater than 1,000 cm, between 10 cm and 100 cm, between 100 cm and 300 cm, between 100 cm and 1,000 cm, between 300 cm and 1,000 cm, any other minimum width capable of uniform or substantially uniform heating, or any suitable combination, sub-combination, range, or sub-range therein. Suitable volumes for the enclosed vessel include, but are not limited to, at least 1,000 $cm^3$, greater than 3,000 $cm^3$, greater than 5,000 $cm^3$, greater than 10,000 $cm^3$, greater than 20,000 $cm^3$, between 3,000 $cm^3$ and 5,000 $cm^3$, between 5,000 $cm^3$ and 10,000 $cm^3$, between 5,000 $cm^3$ and 20,000 $cm^3$, between 10,000 $cm^3$ and 20,000 $cm^3$, any other volumes capable of uniform or substantially uniform heating, or any suitable combination, sub-combination, range, or sub-range therein.

According to embodiments of the disclosure, the enclosed chamber 113 has a hydrogen-containing environment, specifically, between the first decomposing (step 110), the second introducing (step 106) and/or between one, more than one, or all of the other steps of the process 100 within the enclosed chamber 113, allowing for a hydrogen-rich annealing, which reduces or eliminates the formation of hydrogen bubbles within or between the first silicon-containing layer 105, the second silicon-containing layer 107, and/or the additional layer(s) 109. The hydrogen-containing environment is formed by constituents of the silane, hydrogen from a source other than the silane, or a combination thereof. In one embodiment with the hydrogen from the source other than the silane, the hydrogen is introduced to the enclosed chamber 113 between the first decomposing (step 110) and the second introducing (step 106). Additionally or alternatively, the process 100 is devoid of purging between the first decomposing (step 110) and the second introducing (step 106) and/or between one, more than one, or all of the other steps of the process 100 within the enclosed chamber 113.

In one embodiment, the process 100 further includes an additional introducing (step 108) of a third amount 119 of the fluid or a different fluid (for example, the silane, another fluid, and/or a functionalizing precursor, such as, a carbon-containing precursor and/or a fluoro-containing precursor). In such embodiments, the process 100 continues with a thermal processing (step 114), which is a decomposing or a functionalizing.

The coating 121 is formed by one or more of the following fluids: silane, silane and ethylene, silane and an oxidizer, dimethylsilane, dimethylsilane and an oxidizer, trimethylsilane, trimethylsilane and an oxidizer, dialkylsilyl dihydride, alkylsilyl trihydride, non-pyrophoric species (for example, dialkylsilyl dihydride and/or alkylsilyl trihydride), thermally-reacted material (for example, carbosilane and/or carboxysilane, such as, amorphous carbosilane and/or amorphous carboxysilane), species capable of a recombination of carbosilyl (disilyl or trisilyl fragments), methyltrimethoxysilane, methyltriethoxysilane, dimethyldimethoxysilane, dimethyldiethoxysilane, trimethylmethoxysilane, trimethylethoxysilane, ammonia, hydrazine, trisilylamine, Bis(tertiary-butylamino)silane, 1,2-bis(dimethylamino)tetramethyldisilane, dichlorosilane, hexachlorodisilane), organofluorotrialkoxysilane, organofluorosilylhydride, organofluoro silyl, fluorinated alkoxysilane, fluoroalkylsilane, fluorosilane, tridecafluoro 1,1,2,2-tetrahydrooctylsilane, (tridecafluoro-1,1,2,2-tetrahydrooctyl) triethoxysilane, triethoxy (3,3,4,4,5,5,6,6,7,7,8,8,8-tridecafluoro-1-octyl) silane, (perfluorohexylethyl) triethoxysilane, silane (3,3,4,4,5,5,6,6,7,7,8,8,9,9,10,10,10-heptadecafluorodecyl) trimethoxy-, or a combination thereof.

Suitable concentrations of thermally-reactive gas used in the process 100, by volume, are between 10% and 20%, between 10% and 15%, between 12% and 14%, between 10% and 100%, between 30% and 70%, between 50% and 80%, between 70% and 100%, between 80% and 90%, between 84% and 86%, or any suitable combination, sub-combination, range, or sub-range therein.

According to embodiments of the present disclosure, the first introducing (step 104), the first decomposing (step 110), the second introducing (step 106), the second decomposing (step 112), the additional introducing (step 108), and/or the thermal processing (step 114) are any suitable number of times. Suitable numbers for one or more of the cycles include, but are not limited to, once, twice, three times, four times, five times, between two and twenty times, between two and ten times, between five and fifteen times, between five and ten times, between ten and twenty times, or any suitable combination, sub-combination, range, or sub-range therein, depending upon the desired thickness and/or other properties for the coating 121.

Suitable thicknesses of the coating 121 include, but are not limited to, between 50 nanometers and 10,000 nanometers, between 50 nanometers and 1,000 nanometers, between 100 nanometers and 800 nanometers, between 200 nanometers and 600 nanometers, between 200 nanometers and 10,000 nanometers, between 500 nanometers and 3,000 nanometers, between 500 nanometers and 2,000 nanometers, between 500 nanometers and 1,000 nanometers, between 1,000 nanometers and 2,000 nanometers, between 1,000 nanometers and 1,500 nanometers, between 1,500 nanometers and 2,000 nanometers, 800 nanometers, 1,200 nanometers, 1,600 nanometers, 1,900 nanometers, or any suitable combination, sub-combination, range, or sub-range therein.

In one embodiment, the coating 121 is produced with the enclosed vessel 113 being below the decomposition temperature of the fluid and is increased to above the decomposition temperature (for example, prior to, during, and/or after the introducing of the fluid). In a further embodiment, the decomposition temperature is greater than 200° C., greater than 300° C., greater than 350° C., greater than 370° C., greater than 380° C., greater than 390° C., greater than 400° C., greater than 410° C., greater than 420° C., greater than 430° C., greater than 440° C., greater than 450° C., greater than 500° C., between 300° C. and 450° C., between 350° C. and 450° C., between 380° C. and 450° C., between 300° C. and 500° C., between 400° C. and 500° C., or any suitable combination, sub-combination, range, or sub-range therein.

In one embodiment, the coating 121 is produced with the partial pressures for the fluid being between 1 Torr and 10 Torr, 1 Torr and 5 Torr, 1 Torr and 3 Torr, 2 Torr and 3 Torr, 10 Torr and 150 Torr, between 10 Torr and 30 Torr, between 20 Torr and 40 Torr, between 30 Torr and 50 Torr, between 60 Torr and 80 Torr, between 50 Torr and 100 Torr, between 50 Torr and 250 Torr, between 100 Torr and 250 Torr, less than 250 Torr, less than 100 Torr, less than 50 Torr, less than 30 Torr, or any suitable combination, sub-combination, range, or sub-range therein.

In one embodiment, the coating 121 is produced with the temperature and the pressure within the enclosed vessel 113 during one, more than one, or all cycles, being maintained for at least 10 minutes, at least 20 minutes, at least 30 minutes, at least 45 minutes, at least 1 hour, at least 2 hours, at least 3 hours, at least 4 hours, at least 5 hours, at least 7 hours, between 10 minutes and 1 hour, between 20 minutes and 45 minutes, between 4 and 10 hours, between 6 and 8 hours, or any suitable combination, sub-combination, range, or sub-range therein.

The substrate 103 is any suitable material capable of being coated through the process 100. In various embodiments, the substrate 103 is a metallic material that is tempered or non-tempered, has grain structures that are equiaxed, directionally-solidified, and/or single crystal, has amorphous or crystalline structures, is a foil, fiber, a cladding, and/or a film. Suitable metallic materials include, but are not limited to, ferrous-based alloys, non-ferrous-based alloys, nickel-based alloys, stainless steels (martensitic or austenitic), aluminum alloys, composite metals, or combinations thereof. In an alternative embodiment, the metallic material is replaced with a non-metallic material. Suitable non-metal or non-metallic materials include, but are not limited to, ceramics, glass, ceramic matrix composites, or a combination thereof.

In one embodiment, the metallic material has a first iron concentration and a first chromium concentration, the first iron concentration being greater than the first chromium concentration. For example, suitable values for the first iron concentration include, but are not limited to, by weight, greater than 50%, greater than 60%, greater than 66%, greater than 70%, between 66% and 74%, between 70% and 74%, or any suitable combination, sub-combination, range, or sub-range therein. Suitable values for the first chromium concentration include, but are not limited to, by weight, greater than 10.5%, greater than 14%, greater than 16%, greater than 18%, greater than 20%, between 14% and 17%, between 16% and 18%, between 18% and 20%, between 20% and 24%, or any suitable combination, sub-combination, range, or sub-range therein.

In one embodiment, the metallic material is or includes a composition, by weight, of up to 0.08% carbon, between 18% and 20% chromium, up to 2% manganese, between 8% and 10.5% nickel, up to 0.045% phosphorus, up to 0.03% sulfur, up to 1% silicon, and a balance of iron (for example, between 66% and 74% iron).

In one embodiment, the metallic material is or includes a composition, by weight, of up to 0.08% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material is or includes a composition, by weight, of up to 0.03% carbon, up to 2% manganese, up to 0.045% phosphorus, up to 0.03% sulfur, up to 0.75% silicon, between 16% and 18% chromium, between 10% and 14% nickel, between 2% and 3% molybdenum, up to 0.1% nitrogen, and a balance of iron.

In one embodiment, the metallic material is or includes a composition, by weight, of between 14% and 17% chromium, between 6% and 10% iron, between 0.5% and 1.5% manganese, between 0.1% and 1% copper, between 0.1% and 1% silicon, between 0.01% and 0.2% carbon, between 0.001% and 0.2% sulfur, and a balance nickel (for example, 72%).

In one embodiment, the metallic material is or includes a composition, by weight, of between 20% and 24% chromium, between 1% and 5% iron, between 8% and 10% molybdenum, between 10% and 15% cobalt, between 0.1% and 1% manganese, between 0.1% and 1% copper, between 0.8% and 1.5% aluminum, between 0.1% and 1% titanium, between 0.1% and 1% silicon, between 0.01% and 0.2% carbon, between 0.001% and 0.2% sulfur, between 0.001% and 0.2% phosphorus, between 0.001% and 0.2% boron, and a balance nickel (for example, between 44.2% and 56%).

In one embodiment, the metallic material is or includes a composition, by weight, of between 20% and 23% chromium, between 4% and 6% iron, between 8% and 10% molybdenum, between 3% and 4.5% niobium, between 0.5% and 1.5% cobalt, between 0.1% and 1% manganese, between 0.1% and 1% aluminum, between 0.1% and 1% titanium, between 0.1% and 1% silicon, between 0.01% and 0.5% carbon, between 0.001% and 0.02% sulfur, between 0.001% and 0.02% phosphorus, and a balance nickel (for example, 58%).

In one embodiment, the metallic material is or includes a composition, by weight, of between 25% and 35% chromium, between 8% and 10% iron, between 0.2% and 0.5% manganese, between 0.005% and 0.02% copper, between 0.01% and 0.03% aluminum, between 0.3% and 0.4% silicon, between 0.005% and 0.03% carbon, between 0.001% and 0.005% sulfur, and a balance nickel (for example, 59.5%).

In one embodiment, the metallic material is or includes a composition, by weight, of between 17% and 21% chromium, between 2.8% and 3.3% iron, between 4.75% and 5.5% niobium, between 0.5% and 1.5% cobalt, between 0.1% and 0.5% manganese, between 0.2% and 0.8% copper, between 0.65% and 1.15% aluminum, between 0.2% and 0.4% titanium, between 0.3% and 0.4% silicon, between 0.01% and 1% carbon, between 0.001 and 0.02% sulfur, between 0.001 and 0.02% phosphorus, between 0.001 and 0.02% boron, and a balance nickel (for example, between 50% and 55%).

In one embodiment, the metallic material is or includes a composition, by weight, of between 2% and 3% cobalt, between 15% and 17% chromium, between 5% and 17% molybdenum, between 3% and 5% tungsten, between 4% and 6% iron, between 0.5% and 1% silicon, between 0.5% and 1.5% manganese, between 0.005 and 0.02% carbon, between 0.3% and 0.4% vanadium, and a balance nickel.

In one embodiment, the metallic material is or includes a composition, by weight, of up to 0.15% carbon, between 3.5% and 5.5% tungsten, between 4.5% and 7% iron, between 15.5% and 17.5% chromium, between 16% and 18% molybdenum, between 0.2% and 0.4% vanadium, up to 1% manganese, up to 1% sulfur, up to 1% silicon, up to 0.04% phosphorus, up to 0.03% sulfur, and a balance nickel.

In one embodiment, the metallic material is or includes a composition, by weight, of up to 2.5% cobalt, up to 22% chromium, up to 13% molybdenum, up to 3% tungsten, up to 3% iron, up to 0.08% silicon, up to 0.5% manganese, up to 0.01% carbon, up to 0.35% vanadium, and a balance nickel (for example, 56%).

In one embodiment, the metallic material is or includes a composition, by weight, of between 1% and 2% cobalt, between 20% and 22% chromium, between 8% and 10% molybdenum, between 0.1% and 1% tungsten, between 17% and 20% iron, between 0.1% and 1% silicon, between 0.1% and 1% manganese, between 0.05 and 0.2% carbon, and a balance nickel.

In one embodiment, the metallic material is or includes a composition, by weight, of between 0.01% and 0.05% boron, between 0.01% and 0.1% chromium, between 0.003% and 0.35% copper, between 0.005% and 0.03% gallium, between 0.006% and 0.8% iron, between 0.006% and 0.3% magnesium, between 0.02% and 1% silicon+iron, between 0.006% and 0.35% silicon, between 0.002% and 0.2% titanium, between 0.01% and 0.03% vanadium+titanium, between 0.005% and 0.05% vanadium, between 0.006% and 0.1% zinc, and a balance aluminum (for example, greater than 99%).

In one embodiment, the metallic material is or includes a composition, by weight, of between 0.05% and 0.4% chromium, between 0.03% and 0.9% copper, between 0.05% and 1% iron, between 0.05% and 1.5% magnesium, between 0.5% and 1.8% manganese, between 0.5% and 0.1% nickel, between 0.03% and 0.35% titanium, up to 0.5% vanadium, between 0.04% and 1.3% zinc, and a balance aluminum (for example, between 94.3% and 99.8%).

In one embodiment, the metallic material is or includes a composition, by weight, of between 0.0003% and 0.07% beryllium, between 0.02% and 2% bismuth, between 0.01% and 0.25% chromium, between 0.03% and 5% copper, between 0.09% and 5.4% iron, between 0.01% and 2% magnesium, between 0.03% and 1.5% manganese, between 0.15% and 2.2% nickel, between 0.6% and 21.5% silicon, between 0.005% and 0.2% titanium, between 0.05% and 10.7% zinc, and a balance aluminum (for example, between 70.7% to 98.7%).

In one embodiment, the metallic material is or includes a composition, by weight, of between 0.15% and 1.5% bismuth, between 0.003% and 0.06% boron, between 0.03% and 0.4% chromium, between 0.01% and 1.2% copper, between 0.12% and 0.5% chromium+manganese, between 0.04% and 1% iron, between 0.003% and 2% lead, between 0.2% and 3% magnesium, between 0.02% and 1.4% manganese, between 0.05% and 0.2% nickel, between 0.5% and 0.5% oxygen, between 0.2% and 1.8% silicon, up to 0.05% strontium, between 0.05% and 2% tin, between 0.01% and 0.25% titanium, between 0.05% and 0.3% vanadium, between 0.03% and 2.4% zinc, between 0.05% and 0.2% zirconium, between 0.150 and 0.2% zirconium+titanium, and a balance of aluminum (for example, between 91.7% and 99.6%).

In one embodiment, the metallic material is or includes a composition, by weight, of between 0.4% and 0.8% silicon, up to 0.7% iron, between 0.15% and 0.4% copper, up to 0.15% manganese, between 0.8% and 1.2% magnesium, between 0.04% and 0.35% chromium, up to 0.25% zinc, up to 0.15% titanium, optional incidental impurities (for example, at less than 0.05% each, totaling less that 0.15%), and a balance of aluminum (for example, between 95% and 98.6%).

In one embodiment, the metallic material is or includes a composition, by weight, of between 11% and 13% silicon, up to 0.6% impurities/residuals, and a balance of aluminum.

EXAMPLES

In a first comparative example, a comparative chemical vapor deposition coating is produced on stainless steel using silane, with an intermediate nitrogen purge, followed by thermal annealing under vacuum, and followed by another chemical vapor deposition. The comparative coating delaminates.

In a second comparative example, a comparative chemical vapor deposition coating is produced on stainless steel using silane, with an intermediate nitrogen purge, followed annealing in a nitrogen environment, and followed by another chemical vapor deposition. The comparative coating delaminates.

In a third example, consistent with an embodiment of the present disclosure, a chemical vapor deposition coating is produced on stainless steel using silane, without an intermediate purge, followed by annealing without inert gas, and followed by another chemical vapor deposition. The coating does not delaminate.

In a fourth example, consistent with an embodiment of the present disclosure, a chemical vapor deposition coating is produced on stainless steel using silane, without an intermediate purge, followed by annealing without inert gas, and followed by another chemical vapor deposition. The coating does not delaminate.

While the invention has been described with reference to one or more embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims. In addition, all numerical values identified in the detailed description shall be interpreted as though the precise and approximate values are both expressly identified.

What is claimed is:

1. A chemical vapor deposition process, comprising:
    positioning an article having a substrate within an enclosed chamber;
    a first introducing of a first amount of silane to the enclosed chamber, the first amount of the silane remaining within the enclosed chamber for a first period of time;
    a first decomposing of the first amount of the silane during at least a portion of the first period of time; and then,
    a second introducing of a second amount of the silane to the enclosed chamber, the second amount of the silane remaining within the enclosed chamber for a second period of time; and
    a second decomposing of the second amount of the silane during at least a portion of the second period of time;
    wherein the chemical vapor deposition process is devoid of an inert gas purging from conclusion of the first decomposing to inception of the; and
    wherein the chemical vapor deposition process produces a chemical vapor deposition coating devoid of hydrogen bubbles.

2. The chemical vapor deposition process of claim 1, wherein the inert gas purging that the chemical vapor deposition process is devoid of from the conclusion of the first decomposing to the inception of the second introducing is noble gas purging.

3. The chemical vapor deposition process of claim 1, wherein the inert gas purging that the chemical vapor deposition process is devoid of from the conclusion of the first decomposing to the inception of the second introducing is nitrogen purging.

4. The chemical vapor deposition process of claim 1, wherein the enclosed vessel contains constituents of the silane from the conclusion of the first decomposing to the inception of the second introducing.

5. The chemical vapor deposition process of claim 1, wherein the enclosed vessel contains hydrogen from the conclusion of the first decomposing to the inception of the second introducing.

6. The chemical vapor deposition process of claim 1, comprising introducing hydrogen to the enclosed chamber from the conclusion of the first decomposing to the inception of the second introducing.

7. The chemical vapor deposition process of claim 1, wherein the substrate is a metallic alloy.

8. The chemical vapor deposition process of claim 1, wherein the substrate is stainless steel.

9. The chemical vapor deposition process of claim 1, wherein the substrate is aluminum.

10. The chemical vapor deposition process of claim 1, wherein the substrate is glass.

11. The chemical vapor deposition process of claim 1, wherein the substrate is ceramic.

12. The chemical vapor deposition process of claim 1, wherein the chemical vapor deposition process produces a chemical vapor deposition coating, the chemical vapor deposition coating having adhesion to the substrate that is greater than a comparative adhesion between the substrate and a comparative coating formed under the same conditions but with an inert purge between the first decomposing and the second decomposing.

13. The chemical vapor deposition process of claim 1, wherein the chemical vapor deposition process produces a chemical vapor deposition coating, the chemical vapor deposition coating having an internal film stress that is lower than a comparative internal film stress for a comparative coating formed under the same conditions but with an inert gas purge between the first decomposing and the second decomposing.

14. The chemical vapor deposition process of claim 1, wherein the chemical vapor deposition process includes remaining above the decomposition temperature for the silane from the first introducing through the second decomposing.

15. The chemical vapor deposition process of claim 1, wherein the enclosed chamber contains a plurality of articles having the substrate.

16. The chemical vapor deposition process of claim 1, wherein the substrate includes exposed surfaces not visible by line-of-site, the surfaces being coated by the chemical vapor deposition process.

17. A chemical vapor deposition process, comprising:
   providing a substrate within an enclosed chamber;
   a first introducing of a first amount of silane to the enclosed chamber, the first amount of the silane remaining within the enclosed chamber for a first period of time;
   a first decomposing of the first amount of the silane during at least a portion of the first period of time; and then,
   a second introducing of a second amount of the silane to the enclosed chamber, the second amount of the silane remaining within the enclosed chamber for a second period of time; and
   a second decomposing of the second amount of the silane during at least a portion of the second period of time;
   wherein the chemical vapor deposition process produces a chemical vapor deposition coating devoid of hydrogen bubbles.

18. A chemical vapor deposition process, comprising:
   providing a substrate within an enclosed chamber;
   a first introducing of a first amount of silane to the enclosed chamber, the first amount of the silane remaining within the enclosed chamber for a first period of time;
   a first decomposing of the first amount of the silane during at least a portion of the first period of time; and then,
   a second introducing of a second amount of the silane to the enclosed chamber, the second amount of the silane remaining within the enclosed chamber for a second period of time; and
   a second decomposing of the second amount of the silane during at least a portion of the second period of time;
   wherein the chemical vapor deposition process produces a chemical vapor deposition coating devoid of hydrogen bubbles;
   wherein the substrate includes exposed surfaces not visible by line-of-site, the surfaces being coated by the chemical vapor deposition process.

* * * * *